United States Patent
Kondo et al.

(10) Patent No.: US 8,476,724 B2
(45) Date of Patent: Jul. 2, 2013

(54) SPIN WAVE DEVICE

(75) Inventors: Tsuyoshi Kondo, Kanagawa-ken (JP);
Hirofumi Morise, Kanagawa-ken (JP);
Shiho Nakamura, Kanagawa-ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 13/229,966

(22) Filed: Sep. 12, 2011

(65) Prior Publication Data

US 2012/0061782 A1    Mar. 15, 2012

(30) Foreign Application Priority Data

Sep. 14, 2010   (JP) .................. 2010-206165

(51) Int. Cl.
*H01L 29/82* (2006.01)
*G11B 5/127* (2006.01)
*G11C 11/22* (2006.01)
*H01L 21/00* (2006.01)

(52) U.S. Cl.
USPC ........... 257/421; 324/244; 360/324; 365/145; 438/3

(58) Field of Classification Search
USPC ............ 257/421, 295, 422; 303/101; 324/244
See application file for complete search history.

(56) References Cited

U.S. PATENT DOCUMENTS

| | | | |
|---|---|---|---|
| 7,760,474 B1 * | 7/2010 | Huai et al. | 360/324.12 |
| 2007/0259209 A1 | 11/2007 | Slavin et al. | |
| 2007/0285184 A1 | 12/2007 | Eychkmans et al. | |
| 2009/0096044 A1 * | 4/2009 | Eshaghian-Wilner et al. | 257/421 |
| 2009/0180308 A1 * | 7/2009 | Inomata et al. | 365/145 |
| 2009/0213638 A1 * | 8/2009 | Morise et al. | 365/145 |
| 2010/0225312 A1 | 9/2010 | Nakamura et al. | |
| 2010/0314702 A1 * | 12/2010 | Sasaki et al. | 257/421 |
| 2011/0075476 A1 * | 3/2011 | Kajiwara et al. | 365/170 |
| 2011/0129690 A1 * | 6/2011 | Nishimura et al. | 428/800 |
| 2011/0234216 A1 * | 9/2011 | Nakamura et al. | 324/244 |

FOREIGN PATENT DOCUMENTS

JP    2009-508353    2/2009
JP    2009-295824    12/2009

OTHER PUBLICATIONS

Stoecklein, W., et al., "Ferromagnetic resonance studies of exchange-biased Permalloy thin films", Physical Review B, vol. 38, No. 10, Oct. 1, 1988, pp. 6847-6854.

* cited by examiner

*Primary Examiner* — Long Tran
*Assistant Examiner* — Dzung Tran
(74) *Attorney, Agent, or Firm* — Turocy & Watson, LLP

(57) ABSTRACT

A spin wave device comprises a metal layer, a pinned layer, a nonmagnetic layer, a free layer, an antiferromagnetic layer, a first electrode, a first insulator layer, and a second electrode. The pinned layer has a magnetization whose direction is fixed. The free layer has a magnetization whose direction is variable.

12 Claims, 8 Drawing Sheets

| 1 0 | ⋯ | Spin wave device |
| 2 0 | ⋯ | Metal layer |
| 3 0 | ⋯ | Ｐｉｎｎｅｄ layer |
| 4 0 | ⋯ | Nonmagnetic layer |
| 5 0 | ⋯ | Free layer |
| 6 0 | ⋯ | Antiferromagnetic layer |
| 7 0 | ⋯ | Input electrode |
| 8 0 | ⋯ | Insulator layer |
| 9 0 | ⋯ | Output layer |

100 – Insulator layer
110 – Pinned Layer
120 – Antiferromagnetic layer

130 – Intermediate layer
140 – Pinned Layer
150 – Antiferromagnetic layer

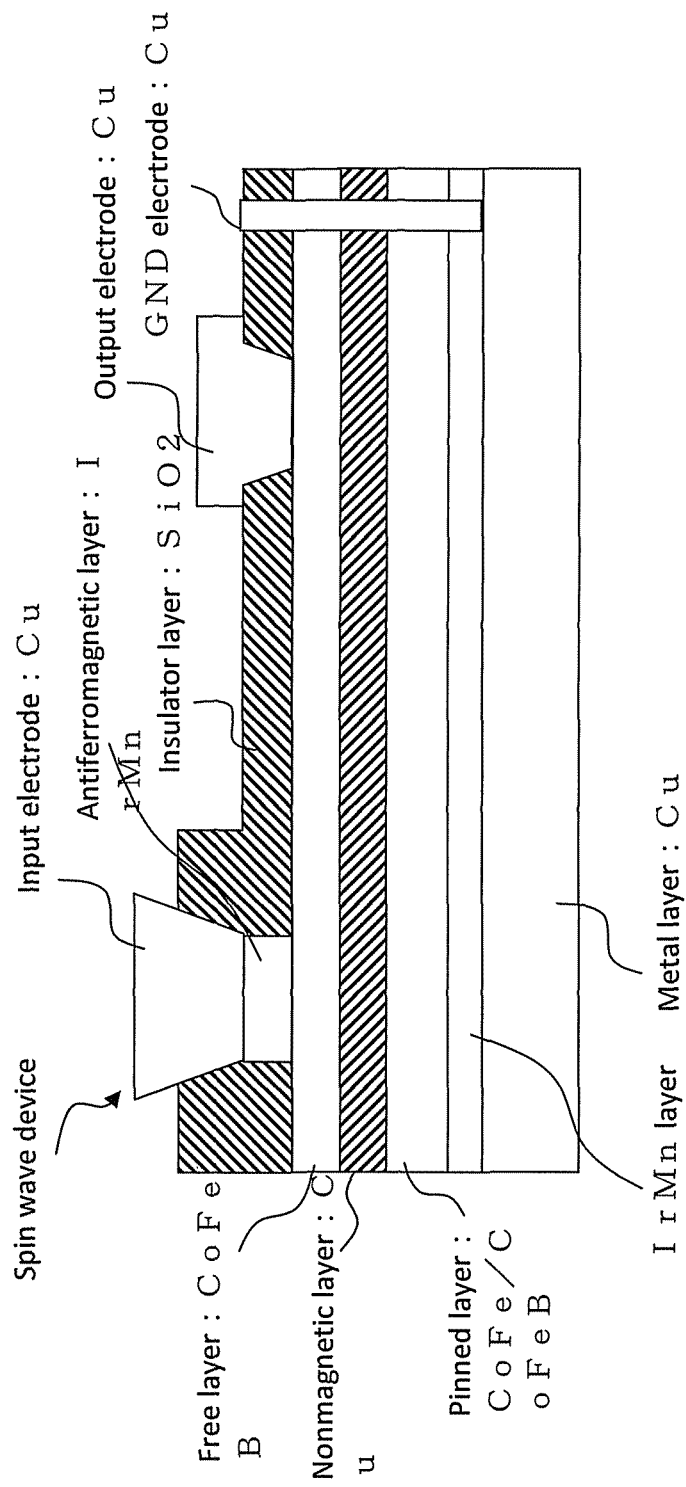

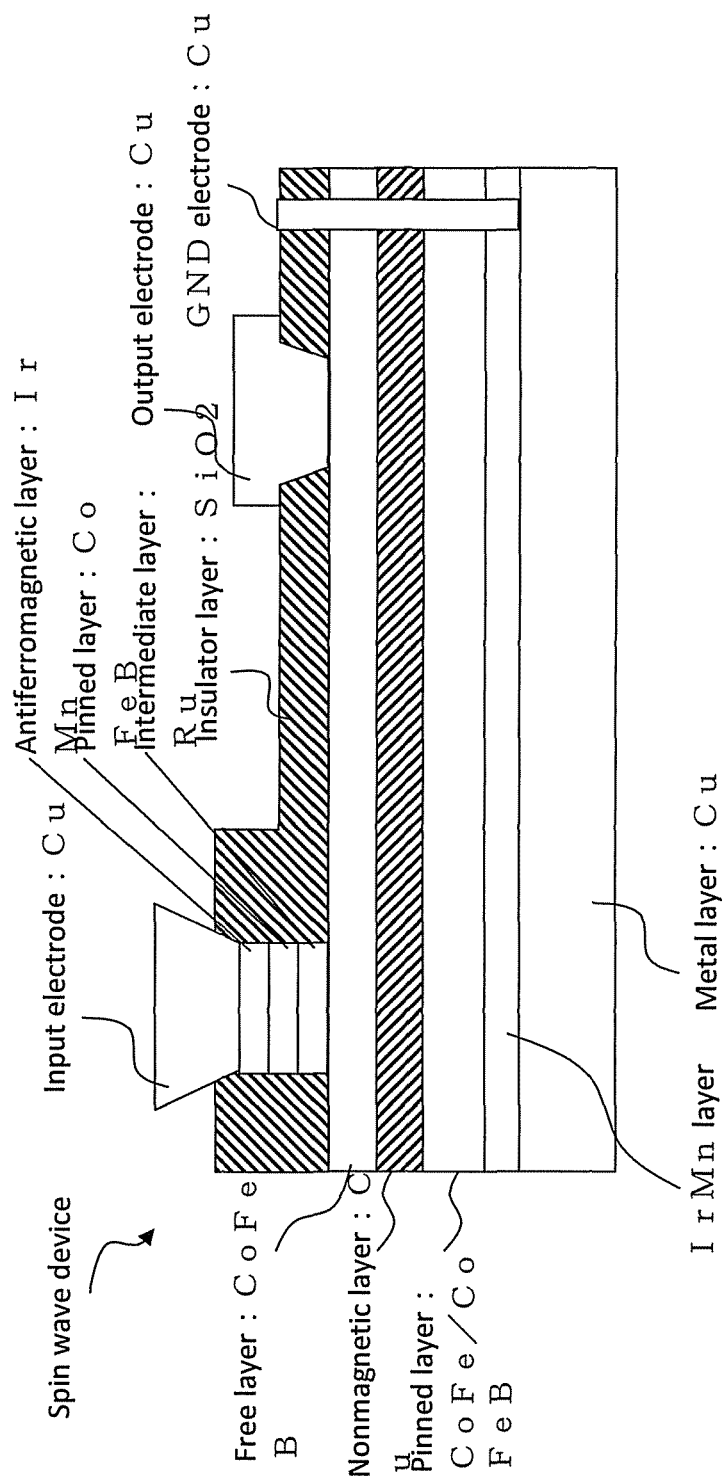

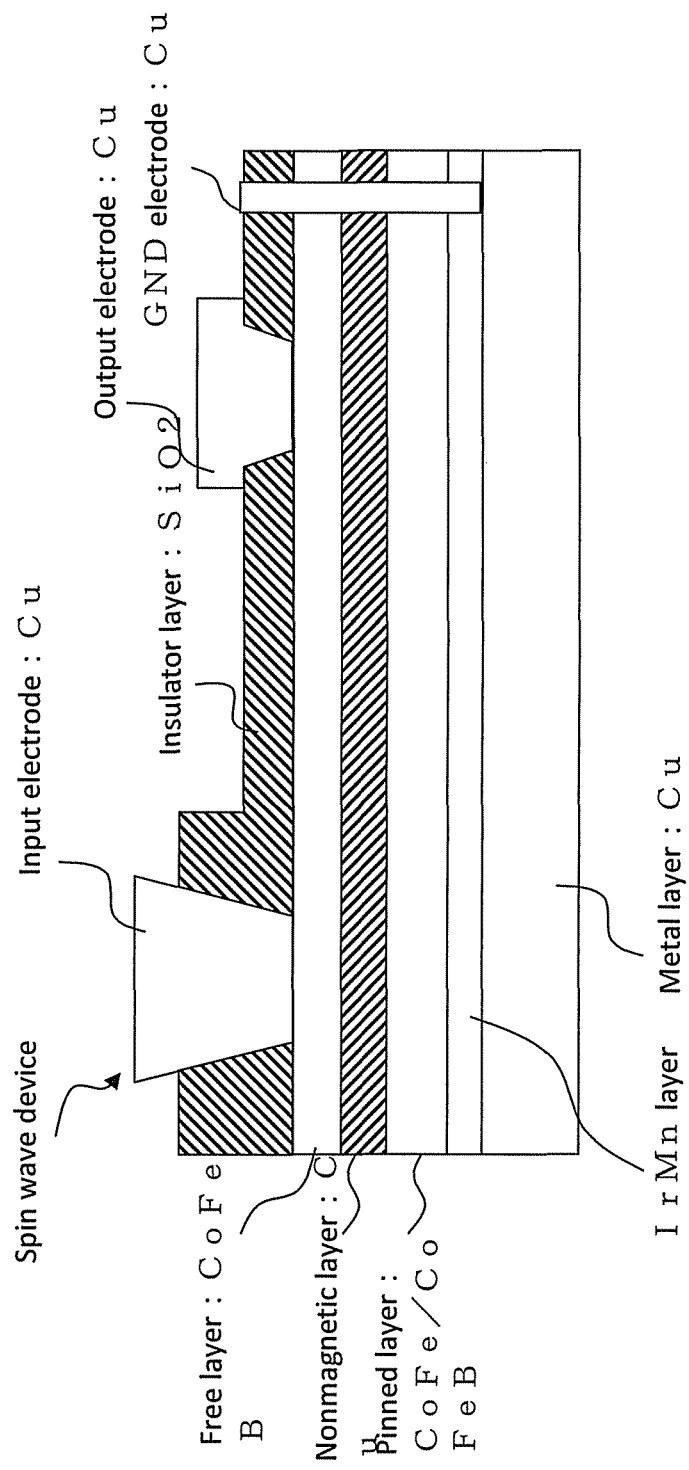

SPIN WAVE DEVICE

CROSS REFERENCE TO RELATED APPLICATION

This application is based upon and claims the benefit of priority from the prior Japanese Patent Application No. 2010-206165, filed on Sep. 14, 2010 the entire contents of which are incorporated herein by reference.

FIELD

Embodiments described herein are related to a spin wave device.

BACKGROUND

Continuous progress of large scale integration (LSI) circuits, based on nano-scale complementary-metal-oxide-semiconductor technologies, has carried developing information technologies.

Recently, however, it is difficult to suppress power consumption in LSI circuits, increasing with expansion of performance requirements for the circuits on large-scale information processing. In particular, power loss, caused by electric charge flow through wiring in the circuits, is a critical issue for further development of LSI technology. Therefore it is desired to realize the way, being available in the circuits, by which one can transmit signals indicating information without electric current.

Spin waves are the propagating disturbances of magnetization in magnetic materials, and can transfer information, being expressed such as magnetization directions, from a point to another in the materials. The information transmission using spin waves is not accompanied with electric current. Recent research achievements in the field of spintronics allow to the generation of spin waves in magnetic thin films using nano-size elements on the films. The spin-wave-devices can be built, which utilize the physical features of spin waves such as superposition to carry out information processing, by monolithic integration of generators, modulators, and detectors for spin waves onto the films.

BRIEF DESCRIPTION OF THE DRAWINGS

Aspects of this disclosure will become apparent upon reading the following detailed description and upon reference to the accompanying drawings. The description and the associated drawings are provided to illustrate embodiments of the invention and not limited to the scope of the invention.

FIG. 6 is a view explaining a working example of a spin wave device.

FIG. 7 is a view explaining a working example of a spin wave device.

FIG. 8 is a view explaining a comparison example of a spin wave device.

DETAILED DESCRIPTION

Figure 1:
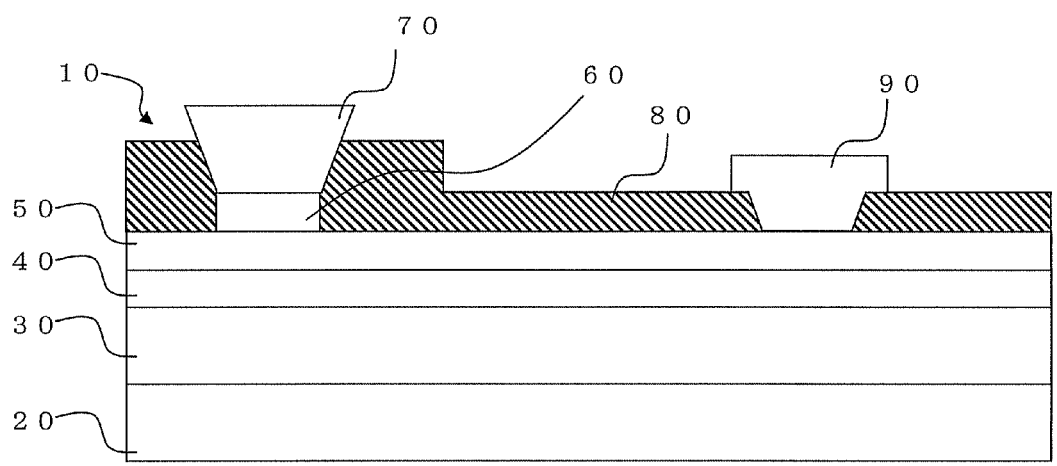
FIG. 1 is a view showing a spin wave device 10 mentioned in a first embodiment.

Embodiments will be described below with reference to drawings. Wherever possible, the same reference numerals or marks will be used to denote the same or like portions throughout figures, and overlapped explanations are omitted in embodiments following a first embodiment.

First Embodiment

FIG. 1 shows a schematic illustration of a spin wave device 10. Spin wave device 10 has three layers, stacked on metal layer 20, which include pinned layer 30, nonmagnetic layer 40, and free layer 50. Antiferromagnetic layer 60 and output electrode 90 are provided on free layer 50. Insulator layer 80 is formed between antiferromagnetic layer 60 and output electrode 90. In other words, antiferromagnetic layer 60 and output electrode 90 are separated by insulator layer 80. Input electrode 70 is provided on antiferromagnetic layer 60. Input electrode 70 and output electrode 90 are surrounded by insulator layer 80. Top surfaces of input electrode 70 and output electrode 90 are uncovered with insulator layer 80. The first part is a part of free layer 50 which is covered with antiferromagnetic layer 60. The second part is a part of free layer 50 which is covered with output electrode 90. The third part is the remaining portion of free layer 50.

Figure 2:
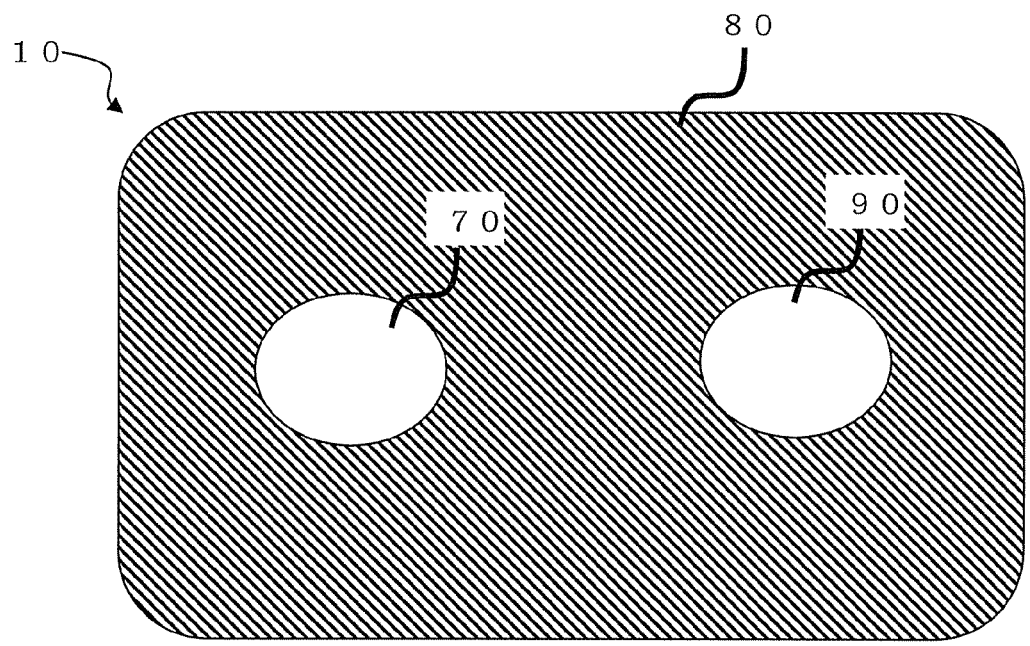
FIG. 2 is a view showing the spin wave device 10 viewing from a top surface of the spin wave device 10.

FIG. 2 shows a schematic illustration of spin wave device 10 viewing from the top. Input electrode 70 and output electrode 90 are surrounded by insulator layer 80. Top surfaces of input electrode 70 and output electrode 90 are not covered with insulator layer 80. The shape of insulator layer 80 is shown to be rectangular, but other shapes, such as a square, circle, ellipsoid, and the like, are also acceptable as shape of insulator layer 80. The shapes of input electrode 70 and output electrode 90 are shown to be a circle, but other shapes, such as a square, rectangular, ellipsoid, and the like, are also acceptable for shape of input electrode 70 and output electrode 90.

Metal layer 20 is used as an electrode with output electrode 90 and input electrode 70, when one applies current to spin device 10. Highly conductive metals, such as copper (Cu) and related alloys can be used as material of metal layer 20. It is prefer that the way to realize thin films with flat surfaces is available for metal layer 20. Typical thickness of metal layer 20 is between 10 nm and 1000 nm.

Pinned layer 30 is ferromagnetic, and its magnetization points to a direction uniformly. Metal alloys such as FeVPd, FeCrPd, and CoFePt can be used as material of pinned layer 30. Pinned layer 30 also comprises one of the metal alloys which have the content being the combination of elements selected from two or more different element groups; group of iron (Fe), cobalt (Co), nickel (Ni), manganese (Mn), and chromium (Cr), and another of platinum (Pt), palladium (Pd), iridium (Ir), rutheniumu (Ru), and rhodium (Rh). The properties of the alloys, mentioned above, can be controlled by changing the content and/or annealing. Ferrimagnetic amorphous alloys, such as TbFeCo or GdFeCo, are also acceptable as the material of pinned layer 30. Ferromagnetic multilayered structures, such as Co/Pt, Co/Pd, and Co/Ni are also acceptable for the material of pinned layer 30. The thin films consisting of these materials show perpendicular magnetic anisotropy, so that magnetization of pinned layer 30 points to the stacking direction of the layers.

Magnetization direction of pinned layer 30 is in plane of the layer, if the layer consists of one of the magnetic metals which contain one or a plural set of elements selected from group of iron (Fe), cobalt (Co), nickel (Ni), manganese (Mn), and chromium (Cr).

Typical thickness of pinned layer 30 is in the range from 4 nm to 30 nm.

Nonmagnetic layer 40 impedes direct magnetic coupling between pinned layer 30 and free layer 50. Either of conductive and isolating materials is acceptable as the material of nonmagnetic layer 40.

One of the metals which contain one or a plural set of elements selected from group of cupper (Cu), gold (Au), silver (Ag), and aluminium (Al) can be used as the conductive material for nonmagnetic layer 40. Typical thickness of nonmagnetic layer 40 is in the range from 1.5 nm to 20 nm. In this case, giant magnetoresistance (GMR) is observed at the part of spin wave device 10, being multi-layered structure comprising free layer 50, nonmangnetic layer 40, and pinned layer 30.

As the insulating material for nonmagnetic layer 40, one of the insulators such as oxides, nitrides, fluorides, oxynitrides, which contain one or a plural set of elements selected from aluminium (Al), titanium (Ti), zinc (Zn), tantalum (Ta), cobalt (Co), nickel (Ni), silicon (Si), magnesium (Mg), and iron (Fe) can be used. For this purpose, semiconductors having wide energy-band gap, such as AlAs, GaN, AlN, ZnSe, ZnO, and related alloys, are also acceptable as the insulator for nonmagnetic layer 40. If nonmagnetic layer 40 consists of the insulating material, tunnel magnetoresistance (TMR) is observed at the part of spin wave device 10, being multi-layered structure comprising free layer 50, nonmangnetic layer 40, and pinned layer 30.

Free layer 50 is ferromagnetic, and its magnetization points to a direction uniformly. Metal alloys such as FeVPd, FeCrPd, and CoFePt can be used as material of free layer 50. Free layer 50 also comprises one of the metal alloys which have the content being the combination of elements selected from two different element groups; group of iron (Fe), cobalt (Co), nickel (Ni), manganese (Mn), and chromium (Cr), and another of platinum (Pt), palladium (Pd), iridium (Ir), ruthenium (Ru), and rhodium (Rh). The properties of the alloys, mentioned above, can be controlled by changing the content and/or annealing.

Ferrimagnetic amorphous alloys, such as TbFeCo or GdFeCo, are also acceptable as the material of free layer 50. Ferromagnetic multilayered structures, such as Co/Pt, Co/Pd, and Co/Ni are also acceptable for the material of free layer 50. The thin films consisting of these materials show perpendicular magnetic anisotropy, so that magnetization of free layer 50 points to the stacking direction of the layers.

Magnetization direction of free layer 50 is in plane of the layer, if the layer consists of one of the magnetic metals which contain one or a plural set of elements selected from group of iron (Fe), cobalt (Co), nickel (Ni), manganese (Mn), and chromium (Cr).

Ferrite and related materials, such as γ-phase iron(III) oxide, yttrium-iron garnet, manganese ferrite are also acceptable as the material for free layer 50. Spin wave transmission loss in free layer 50 can be reduced by using these materials for free layer 50. Typical thickness of free layer 50 is in the range from 4 nm to 30 nm.

Magnetization direction of magnetic materials is affected with not only external applied field, but also demagnetizing field and exchange interaction between magnetic atoms. These can be considered to be a field, so called effective field, exerting magnetic monuments in the magnetic materials.

Antiferromagnetic layer 60 causes change in electron states of a small number of atomic layers of free layer 50 at the interface between antiferromagnetic layer 60 and free layer 50, and then, induces an effective field on free layer 50, pointing a direction which can be set during the magnetization process of the device.

Mn-related alloys, which contain one or a plural set of elements selected from Pd, Ir, Rh, Ru, Osmium (Os), Ni, and Fe can be used as the material of antiferromagnetic layer 60. The platinum(Pt)—Mn-related alloys, which contain one or a plural set of elements selected from Pd, Ir, Rh, Ru, Au, Ag, Os, Cr, and Ni, are also acceptable as the material of antiferromagnetic layer 60. These materials are conductive, and the Mn ions in the alloys easily make antiferromagnetic coupling with nearest Mn-neighbours. The antiferromagnetic properties can be controlled by the composition of the alloys. One or a plural set of elements selected from Ar, Ne, Xe, and Kr can be doped into antiferromagnetic layer 60 to control its properties.

In the case where the magnetization of free layer 50 is perpendicular to the layer plane, the metals, which contain one or a plural set of elements selected from Pt, Pd, and Ru, can be used as the material of antiferromagnetic layer 60.

Typical thickness of antiferromagnetic layer 60 is in the range from 10 nm to 50 nm.

One can use input electrode 70 to induce spin torque in free layer 50 by applying electric current. The spin torque in the part of free layer 50 underneath input electrode 70 generates spin waves. The metals, which contain one or a plural set of elements selected from cupper (Cu), gold (Au), silver (Ag), and aluminium (Al), are acceptable as the material of input electrode 70. Spin wave device 10 can have a plural set of input electrode 70. The area size of input layer 70 is same or smaller than that of antiferromagnetic layer 60. In this embodiment, this is because it is preferable that the effective field, originating from antiferromagnetic layer 60, is applied to only the part of free layer 50, in where the current is spin-polarized. Antiferromagnetic layer is covered with insulator layer 80, if the area size of input layer 70 is smaller than that of antiferromagnetic layer 60.

The insulator layer 80 insulates output electrode 90 and sets of antiferromagnetic layer 60 and input electrode 70 each other. For an example, one can use oxides and nitrides comprising the elements such as Al, Mg, and Si, as the material of insulator layer 80. It is preferable that the area size of insulator layer 80 is larger than the area size of input electrode 70. This is because the influence of the effective field should be suppressed at the most of free layer 50 except the part of that underneath antiferromagnetic layer 60.

Typical thickness of the insulator layer 80 is in the range from 100 nm to 500 nm.

One can use output electrode 90 to detect spin-wave signals using magnetoresistance observed in the structure consisting of free layer 50, nonmagnetic layer 40 and pinned layer 30. The same materials used for input electrode 70 are acceptable as the material for output electrode 90. Spin wave device 10 can have a plural set of output electrode 90.

The working principle of spin wave device 10 is described below.

In spin wave device 10, information signals, as being spin waves in free layer 50, are transferred from input electrode 70 to output electrode 90.

One can apply electric current between input electrode 70 and metal layer 20. This current induces the precession of magnetization in the part of free layer 50 underneath input electrode 70. The induced precession propagates and spread to other part of free layer 50. When the spin waves reach the part underneath output electrode 90, one obtains the change in resistance, as the output signal, of the structure consisting of free layer 50, nonmagnetic layer 40 and pinned layer 30. Or, an electromotive force can be obtained on output electrode 90 as the output signal induced by the combination of spin pumping, a phenomenon which the precession in free layer 50 causes spin-polarization of conduction electron in output electrode 90, and inverse spin Hall effect (inverse SHE), being which spin-dependent scattering of conduction electron, during diffusion process, causes electromotive force in output electrode 90.

The effective field in the part of free layer 50, resulting from existence of antiferromagnetic layer 60, allow the generation of spin waves with the relatively high frequency which show high-speed group velocities.

Figure 3:
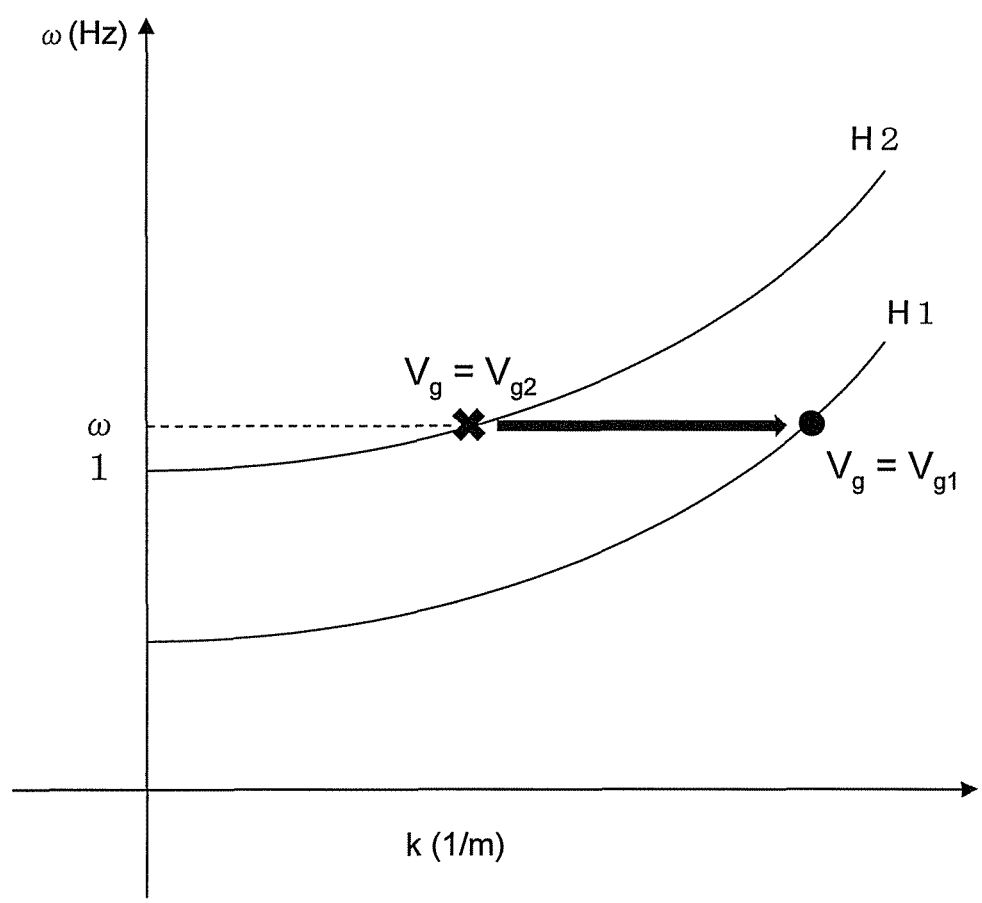
FIG. 3 is a view showing a relation between frequency caused by magnetic field and wave number.

FIG. 3 shows a schematic diagram explaining the typical dispersion relationship between frequency ω (Hz) and wave number k (1/m) of spin waves.

Lines labelled as H1 and H2 in the diagram show the ω·k dispersion relationships for spin waves with (H2) and without (H1) effective field.

As shown in FIG. 3, ω can be expressed as the function with the variable k, being the polynomial of degree two or greater. In general, group velocity of the spin waves, being proportional to derivative dω/dk, depends on ω and k. Assume that a spin wave with a frequency of ω1 is obtained, being on the dispersion relationship of H2, in the part of free layer 50 underneath input electrode 70 by applying a current between input electrode 70 and metal layer 20. The propagating spin wave in the part of free layer 50 uncovered with antiferromagnetic layer 60 has a group velocity of Vg1. The Vg1 is larger than a group velocity Vg2 with a contrastive condition H1, in which all of free layer 50 is covered with antiferromagnetic layer 60.

First Modified Example

Figure 4:
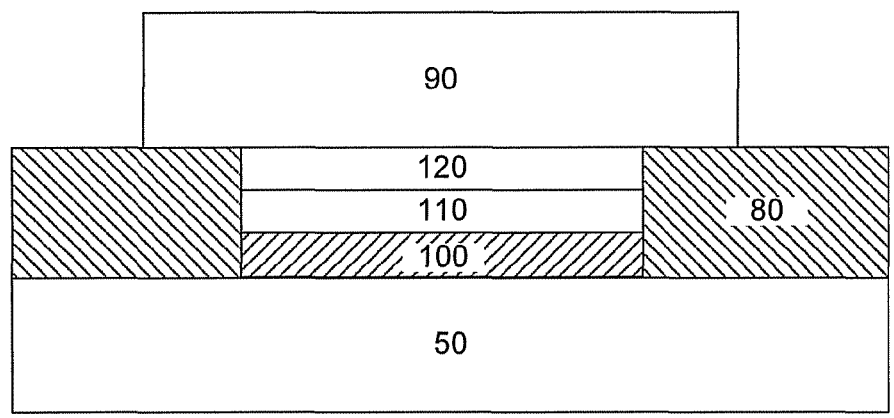
FIG. 4 is a view showing a modified example of the spin wave device 10.

FIG. 4 shows a schematic illustration of the first modified example for spin wave device 10, describing the modification on the output electrode. In this example, multi-layered structure, comprising insulator layer 100, pinned layer 110, and antiferromagnetic layer 120 is put between output electrode 90 and free layer 50. The three layers are stacked the following order of insulator layer 100, pinned layer 110, and antiferromagnetic layer 120 on free layer 50.

For an example, oxides and nitrides comprising the elements such as Al, Ti, Zn, Ta, Co, Ni, Si, Mg, and Fe, can be used as the material of insulator layer 100.

The wide-energy-band-gap semiconductors, such as AlAs, GaN, AlN, ZnSe, and ZnO, are acceptable as the material of insulator layer 100.

In this case, TMR is observed at the multi-layered structure comprising free layer 50, insulator layer 100, and pinned layer 110.

Typical thickness of the insulator layer 100 is in the range from 0.2 nm to 2.0 nm.

For pinned layer 110, one can use the same materials which can be used as the materials of pinned layer 30. The magnetization direction of pinned layer 110 is fixed to a direction with antiferromagnetic layer 120. IrMn and related alloys are typical choices for the material of antiferromagnetic layer 120.

Second Modified Example

Figure 5:
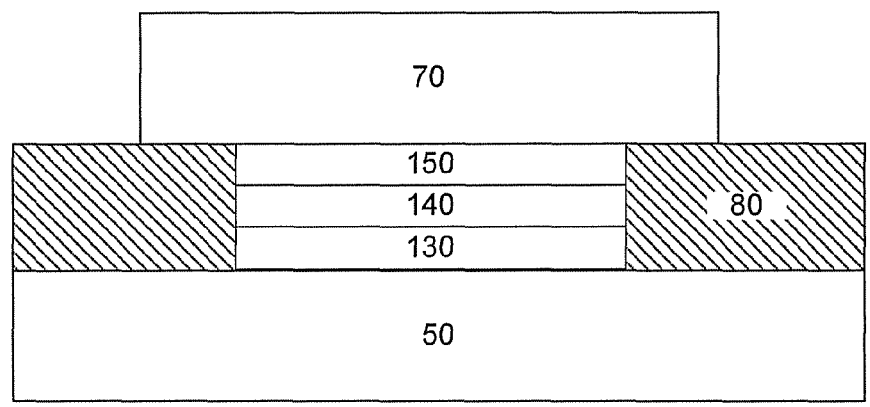
FIG. 5 is a view showing a modified example of the spin wave device 10.

FIG. 5 shows a schematic illustration of the second modified example for spin wave device 10, describing the modification on the input electrode. In this example, multi-layered structure, comprising intermediate layer 130, pinned layer 140, and antiferromagnetic layer 150 is put between input electrode 70 and free layer 50. The three layers are stacked in the order of intermediate layer 130, pinned layer 140, and antiferromagnetic layer 150, on free layer 50. This multi-layered structure works as same as antiferromagnetic layer 50.

The metals, which contain one or a plural set of elements selected from Ag, Cu, Ru, Rh, and Ir, are acceptable as the material of intermediate layer 130. Typical thickness of the intermediate layer 130 is in the range from 1 nm to 15 nm. With the intermediate layer thickness in this range, exchange coupling arises between free layer 50 and pinned layer 140. As the result, elective field originating from the multi-layered structure is applied to the part of free layer 50 underneath input electrode 70, so that high speed group velocity can be obtained.

Magnitude of effective field can be defined by the thickness of intermediate layer 130. In other words, the frequency of generated spin waves can be modulated by changing the thickness of intermediate layer 130.

By using a number of the input electrodes having various thicknesses of the intermediate layers, spin-wave frequency-division multiplex can be realized in the spin wave device.

The materials for pinned layer 140 are as same as the materials for pinned layer 30.

As the material of antiferromagnetic layer 150, the Mn-related alloys, which contain one or a plural set of elements selected from Pd, Ir, Rh, Ru, Os, Ni, and Fe can be used. The Pt—Mn-related alloys, which contain one or a plural set of elements selected from Pd, Ir, Rh, Ru, Au, Ag, Os, Cr, and Ni, are also acceptable as the material of antiferromagnetic layer 150. The antiferromagnetic properties can be controlled by the composition of the alloys. One or a plural set of elements selected from Ar, Ne, Xe, and Kr can be doped into antiferromagnetic layer 150 to control its properties.

First Working Example

A spin wave device shown in FIG. 6 was prepared, measured center frequency and group velocity of spin waves generated in the device. Cu was used for a metal layer. A multilayer of CoFe/CoFeB was used for a pinned layer. CoFeB was used for a free layer. IrMn was used for an antiferromagnetic layer. Cu was used for an input electrode and an output electrode. $SiO_2$ was used for an insulator layer. An IrMn layer was formed between the pinned layer and the metal layer as an antiferromagnetic layer. Magnetization directions of the pinned layer and the free layer were parallel to the plane of the layers. A ground (GND) electrode was formed to have electric access to the metal layer from top of the device.

The shape of the input electrode and the output electrode was circle, and their diameter was 40 nm. The distance between the input electrode and the output electrode was 10 μm.

The preparation procedure of the spin wave device in detail is described below.

The metal layer was deposited on a Si wafer, and the wafer was introduced into an ultrahigh-vacuum sputtering system.

The IrMn layer, the pinned layer, the nonmagnetic layer, the free layer, and the antiferromagnetic layer were deposited in the order mentioned above. A cover layer consisting of Ru was deposited on top of the layers. The pinned layer and the free layer were magnetized by applying a magnetic field, and annealed simultaneously.

A photo-resist film was prepared on the cover layer by spin coating technique. By using a UV-light exposure system with a KrF-excimer laser (a KrF-stepper), an opening on the photo-resist film for vertical interconnect access (via) to the metal layer was prepared. The part of layers on the metal layer uncovered with the photo-resist film was removed by ion milling process.

An electron-beam (EB) resist film was prepared on the top of the device by spin coating technique. The cylindrical masks consisting of EB-resist were formed at the positions of the input electrodes by an EB-lithography technique. After that, the part of the layers on the free layer uncovered with the EB-resist masks was removed by ion milling process.

Again, an electron-beam (EB) resist film was prepared on the top of the device by spin coating technique. By the EB-lithography, the EB-resist film was patterned into a mask having the openings, which located at the positions of the GND electrode, the input electrodes and the output electrodes.

By chemical vapor deposition (CVD), a Cu thin film was prepared on the top of the device covered by the EB-resist mask. Then, the Cu film resulted in the GND, input, and output electrodes by lift-off process.

The lift-off process was followed by the preparation of the insulator layer. A SiO film was deposited on the top of the device using a CVD machine. After that, a planarization process by ion milling was applied to the device surface. As a result, the top of the electrodes were exposed on the device surface.

Next, a photo-resist film was prepared on the device surface by spin coating technique. By using a KrF-stepper, the photo-resist film was processed into a mask having openings to prepare metal lead lines for the electrodes. Finally, the metal lead lines on the top of the device were obtained by the combination of Cu—CVD and lift-off processes.

The spin-wave transmission characteristic on the prepared device was evaluated by using a spectrum analyzer and an ultra-high speed digital oscilloscope. As a result, a spin wave, transferring in the free layer, with a center frequency of 16 GHz and a group velocity of 1.5 μm/nsec was obtained, when a 200-psec-width pulse current into an input electrode of the device was applied.

Second Working Example

As shown in FIG. 7, a spin wave device for the second working example was prepared in which the antiferromagnetic layer was substituted with the multi-layered structure comprising an intermediate layer, a pinned layer, and an antiferromagnetic layer, described in the case of the second modified example.

The spin-wave transmission characteristic on the second device was evaluated by the same procedure mentioned above. As a result, a spin wave was obtained, transferring in the free layer, with a center frequency of 24.4 GHz and a group velocity of 2 μm/nsec, when a 200-psec-width pulse current into an input electrode of the device was applied.

Comparison Example

As shown in FIG. 8, a spin wave device was prepared for the comparison example in which the antiferromagnetic layer was omitted from the device structure.

The spin-wave transmission characteristic on the control device was evaluated by the same procedure mentioned above. As a result, we obtained a spin wave, transferring in the free layer, with a center frequency of 12.4 GHz and a group velocity of 0.98 μm/nsec, when a 200-psec-width pulse current into an input electrode of the device was applied.

It was confirmed that the group velocity and center frequency of spin wave propagating in the spin wave device were raised by providing larger effective field, originating from the antiferromagnetic layer or the multi-layered structure mentioned above, to the free layer partially.

While certain embodiments of the embodiment of the invention have been described, these embodiments have been presented by way of example only, and are not intended to limit the scope of the embodiment of the inventions. Indeed, the novel elements and apparatuses described herein may be embodied in a variety of other forms; furthermore, various omissions, substitutions and changes in the form of the methods and systems described herein may be made without departing from the spirit of the embodiment of the invention. The accompanying claims and their equivalents are intended to cover such forms or modifications as would fall within the scope and spirit of the embodiment of the invention.

What is claimed is:

1. A spin wave device comprising:
   a metal layer;
   a pinned layer provided on the metal layer in which a direction of magnetization is fixed;
   a nonmagnetic layer provided on the pinned layer;
   a free layer provided on the nonmagnetic layer in which a direction of magnetization is variable;
   an antiferromagnetic layer connected to a first part of a top surface of the free layer;
   a first electrode provided on a second part of the top surface of the free layer, wherein the second part is spaced apart from the first part;
   a first insulator layer provided on a third part of the top surface of the free layer and is prepared between the first part and the second part; and
   a second electrode provided on the antiferromagnetic layer.

2. The device of claim 1, wherein a thickness of the first insulator layer at a peripheral of the first electrode is larger than a thickness of the first insulator layer at a peripheral of the second electrode, and a top surface of the first electrode is uncovered with the first insulator layer.

3. The device of claim 1, wherein the device detects spin waves propagating on the free layer, using a current between the metal layer and the first electrode.

4. The device of claim 1, wherein the antiferromagnetic layer comprises Mn-related alloys, which contain one or a plural set of elements selected from Pd, Ir, Rh, Ru, Os, Ni, and Fe.

5. The device of claim 1, wherein the antiferromagnetic layer comprises Pt—Mn-related alloys, which contain one or a plural set of elements selected from Pd, Ir, Rh, Ru, Au, Ag, Os, Cr, and Ni.

6. The device of claim 4, wherein the antiferromagnetic layer comprises one or a plural set of elements selected from Ar, Ne, Xe, and Kr.

7. The device of claim 5, wherein the antiferromagnetic layer comprises one or a plural set of elements selected from Ar, Ne, Xe, and Kr.

8. A spin wave device comprising:
   a metal layer;
   a first pinned layer provided on the metal layer in which a direction of magnetization is fixed;
   a nonmagnetic layer provided on the first pinned layer;
   a free layer provided on the nonmagnetic layer in which a direction of magnetization is variable;
   a multi-layered structure provided on a first part of a top surface of the free layer and the multi-layered structure comprised of an intermediate layer, a second pinned layer, and an antiferromagnetic layer stacked in this order;

a first electrode provided on a second part of the top surface of the free layer, wherein the second part is spaced apart from the first part;

an insulator layer provide on a third part of the top surface of the free layer and is prepared between the first part and the second part; and a second electrode provided on the multi-layered structure.

9. The device of claim 8, wherein the intermediate layer contains one or a plural set of elements selected from Ag, Cu, Ru, Rh, and Ir.

10. The device of claim 8, wherein the second pinned layer contains one or a plural set of elements selected from Fe, Co, Ni, and Mn.

11. The device of claim 8, wherein the antiferromagnetic later comprises Mn-related alloys, which contain one or a plural set of elements selected from Pd, Ir, Rh, Ru, Os, Ni, and Fe.

12. The device of claim 11, wherein the antiferromagnetic layer comprises one or a plural set of elements selected from Ar, Ne, Xe, and Kr.

* * * * *